(12) United States Patent
Akai et al.

(10) Patent No.: US 8,633,400 B2
(45) Date of Patent: Jan. 21, 2014

(54) MULTILAYER PRINTED WIRING BOARD AND METHOD FOR MANUFACTURING MULTILAYER PRINTED WIRING BOARD

(75) Inventors: Sho Akai, Ibi-gun (JP); Tatsuya Imai, Ibi-gun (JP); Iku Tokihisa, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 264 days.

(21) Appl. No.: 12/568,467

(22) Filed: Sep. 28, 2009

(65) Prior Publication Data
US 2010/0126758 A1    May 27, 2010

Related U.S. Application Data

(60) Provisional application No. 61/101,459, filed on Sep. 30, 2008.

(51) Int. Cl.
*H05K 1/11*    (2006.01)

(52) U.S. Cl.
USPC ........... 174/262; 174/263; 174/264; 174/265; 361/792; 361/793; 361/794; 361/795

(58) Field of Classification Search
USPC ................... 174/257, 262–266; 361/792–795
See application file for complete search history.

(56) References Cited

U.S. PATENT DOCUMENTS

| | | | | |
|---|---|---|---|---|
| 6,828,510 | B1 * | 12/2004 | Asai et al. | 174/255 |
| 7,696,442 | B2 * | 4/2010 | Muramatsu et al. | 174/260 |
| 2003/0008075 | A1 * | 1/2003 | Ueno et al. | 427/304 |
| 2003/0019568 | A1 * | 1/2003 | Liu et al. | 156/245 |
| 2003/0135994 | A1 | 7/2003 | Shutou et al. | |
| 2004/0134682 | A1 | 7/2004 | En et al. | |
| 2008/0261020 | A1 * | 10/2008 | Kawaguchi et al. | 428/319.1 |
| 2009/0218125 | A1 | 9/2009 | Nakai et al. | |

FOREIGN PATENT DOCUMENTS

| | | |
|---|---|---|
| JP | 59-25297 | 2/1984 |
| JP | 2-19994 | 5/1990 |
| JP | 3-3298 | 1/1991 |
| JP | 7-202419 | 8/1995 |
| JP | 2000-340948 | 12/2000 |
| JP | 2001-144446 | 5/2001 |
| JP | 2001-203462 | 7/2001 |
| JP | 2007-107080 | 4/2007 |
| TW | 584596 B | 4/2004 |
| TW | I278265 B | 4/2007 |

* cited by examiner

*Primary Examiner* — Jayprakash N Gandhi
*Assistant Examiner* — Dion Ferguson
(74) *Attorney, Agent, or Firm* — Oblon, Spivak, McClelland, Maier & Neustadt, L.L.P.

(57) ABSTRACT

A multilayer printed wiring board including a first interlayer resin insulation layer, a first conductive circuit formed on the first interlayer resin insulation layer, a second interlayer resin insulation layer formed on the first interlayer resin insulation layer and the first conductive circuit and having an opening portion exposing a portion of the first conductive circuit, a second conductive circuit formed on the second interlayer resin insulation layer, a via conductor formed in the opening portion of the second interlayer resin insulation layer and connecting the first conductive circuit and the second conductive circuit, and a coating layer having a metal layer and a coating film and formed between the first conductive circuit and the second interlayer resin insulation layer. The metal layer is formed on the surface of the first conductive circuit and the coating film is formed on the metal layer.

21 Claims, 11 Drawing Sheets

A

B

A

B

C

D

A

B

C

D

MULTILAYER PRINTED WIRING BOARD AND METHOD FOR MANUFACTURING MULTILAYER PRINTED WIRING BOARD

CROSS-REFERENCE TO RELATED APPLICATIONS

The present application claims the benefits of priority to U.S. Application No. 61/101,459, filed Sep. 30, 2008. The contents of that application are incorporated herein by reference in their entirety.

BACKGROUND OF THE INVENTION

1. Field of the Invention

The present invention is related to a multilayer printed wiring board and to a method for manufacturing a multilayer printed wiring board.

2. Discussion of the Background

A method in which the surface of a conductive circuit made of copper is roughened (roughened surface) to improve its adhesiveness through an anchoring effect is suggested. Another method is also suggested to enhance the adhesiveness between conductive circuits and interlayer resin insulation layers, in which a metal film made of a copper-tin alloy is formed on the surface of a conductive circuit made of copper (see Japanese Laid-Open Patent Publication 2000-340948). The contents of this publication are incorporated herein by reference in their entirety.

SUMMARY OF THE INVENTION

According to one aspect of the present invention, a multilayer printed wiring board includes a first interlayer resin insulation layer, a first conductive circuit formed on the first interlayer resin insulation layer, a second interlayer resin insulation layer formed on the first interlayer resin insulation layer and the first conductive circuit and having an opening portion exposing a portion of the first conductive circuit, a second conductive circuit formed on the second interlayer resin insulation layer, a via conductor formed in the opening portion of the second interlayer resin insulation layer and connecting the first conductive circuit and the second conductive circuit, and a coating layer having a metal layer and a coating film and formed between the first conductive circuit and the second interlayer resin insulation layer. The metal layer is formed on the surface of the first conductive circuit and the coating film is formed on the metal layer.

According to another aspect of the present invention, a method for manufacturing a multilayer printed wiring board includes forming a first interlayer resin insulation layer, forming a first conductive circuit on the first interlayer resin insulation layer, forming on the first conductive circuit a coating layer, forming a second interlayer resin insulation layer on the first interlayer resin insulation layer and the first conductive circuit, forming an opening portion in the second interlayer resin insulation layer exposing a portion of the first conductive circuit, removing a portion of the coating layer exposed by the opening portion of the second interlayer resin insulation layer, forming a second conductive circuit on the second interlayer resin insulation layer, and forming in the opening portion of the second interlayer resin insulation layer a via conductor which connects the first conductive circuit and the second conductive circuit. The coating layer has a metal layer and a coating film. The metal layer is formed on the surface of the first conductive circuit. The coating film is formed on the metal layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
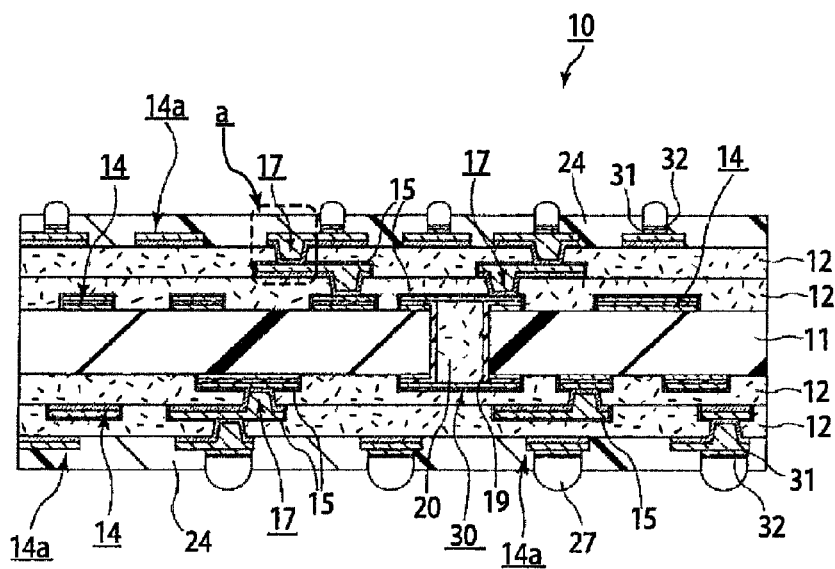
FIG. 1A is a cross-sectional view schematically showing a multilayer printed wiring board according to the first embodiment.
FIG. 1B is a partially magnified cross-sectional view showing region "a" of the multilayer printed wiring board in FIG. 1A.
Figure 1:
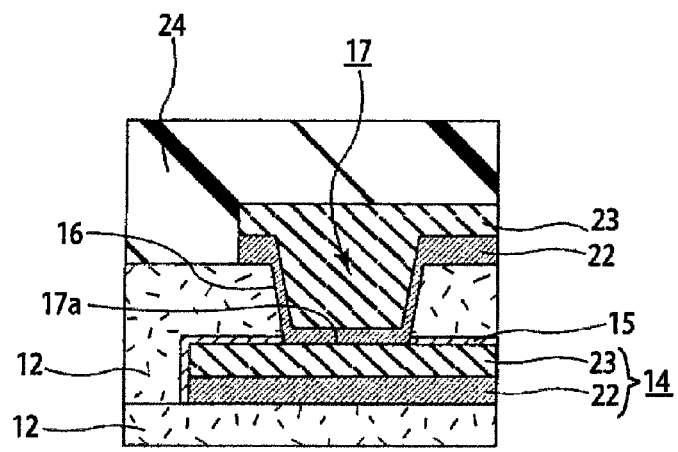

The embodiments will now be described with reference to the accompanying drawings, wherein like reference numerals designate corresponding or identical elements throughout the various drawings.

First Embodiment

Here, a multilayer printed wiring board and its manufacturing method according to the first embodiment are described.

FIG. 1A is a cross-sectional view schematically showing a multilayer printed wiring board according to the first embodiment. FIG. 1B is a cross-sectional view partially magnifying region "a" of the multilayer printed wiring board shown in FIG. 1A. In multilayer printed wiring board 10 of the first embodiment shown in FIGS. 1A and 1B, conductive circuits 14 and interlayer resin insulation layers 12 are alternately laminated on both surfaces of insulative substrate 11. Conductive circuits 14 sandwiching insulative substrate 11 are electrically connected by means of through-hole conductors 19; and conductive circuits 14 sandwiching interlayer resin insulation layer 12 are electrically connected by means of via conductors 17. Also, resin filler layer 20 is formed in through-hole conductors 19, and conductive circuit 30 is formed to cover resin filler layer 20. Solder resist layer 24 is formed on the outermost layer of multilayer printed wiring board 10. In solder resist layer 24, opening portions are formed that reach the surface of conductive circuit (14a) of the outermost layer. On conductive circuit (14a) at the bottoms of the opening portions, solder bumps 27 are formed through protective layers 31, 32. Here, on the surface of conductive circuit 14 (inner-layer conductive circuit) positioned in an inner layer of multilayer printed wiring board 10, a metal layer containing Sn is formed, and a coating film made of a silane coupling agent is further formed on the metal layer (hereinafter, a metal layer and a coating film on such a metal layer are altogether referred to as a conductive-circuit coating layer and are indicated as conductive-circuit coating layer 15 in FIGS. 1A and 1B). In addition, in the present specification, an outermost-layer conductive circuit indicates a conductive circuit formed on the outermost interlayer resin insulation layer. Also, an inner-layer conductive circuit indicates a conductive circuit other than the outermost-layer conductive circuits.

Also, as shown in FIG. 1B, inner-layer conductive circuit 14 formed on interlayer resin insulation layer 12 is made up of electroless copper-plated film 22 and electrolytic copper-plated film 23 formed on electroless copper-plated film 22. Furthermore, on part of its surfaces (on the side surfaces of conductive circuit 14, and on the top surface of conductive circuit 14 except the parts in contact with bottom portions (17a) of via conductors 17), a metal layer containing Sn and a coating film made of a silane coupling agent formed on the metal layer are formed. Also, on conductive circuit 14, via conductors 17 are formed, and the bottom portions of via conductors 17 are directly connected to electrolytic copper-plated film 23 that forms conductive circuit 14. Namely, on parts of the top surface of conductive circuit 14, which are to be connected to the bottom portions of via conductors 17, the metal layer and the coating film do not exist. On the top surface of the conductive circuit except the parts that are connected to via conductors 17, and on the side surfaces of the conductive circuit, the metal layer and the coating film are formed.

In a multilayer printed wiring board according to an embodiment of the present invention, the cross-section of a via conductor that forms the multilayer printed wiring board is tapered (for example, see FIGS. 1A and 1B). In the present specification, the portion of the via conductor with a narrower width due to the tapered shape is referred to as the bottom of the via conductor. Also, in the present specification, regardless of its actual upper or lower orientation, the conductive circuit surface that comes in contact with the bottom of the via conductor is referred to as "the top surface of the conductive circuit."

As so described, on the predetermined parts of conductive circuit 14 positioned in an inner-layer, a metal layer containing Sn is formed and a coating film made of a silane coupling agent is further formed on the metal layer. Conductive circuit 14 and interlayer resin insulation layer 12 are securely adhered by means of the metal layer and the coating film. Such a situation is described in further detail.

In multilayer printed wiring board 10 shown in FIGS. 1A and 1B, the metal layer containing Sn formed on the surface of conductive circuit 14 is a compound metal layer of Sn and Cu. Specifically, the metal layer contains $Cu_6Sn_5$ and $Cu_3Sn$. Then, when the metal layer is formed, hydroxyl groups are thought to be adhered to its surface. If hydroxyl groups are adhered to the surface of the metal layer, they react easily with a silane coupling agent through dehydration reactions. Accordingly, the metal layer and the coating film of a silane coupling agent bond securely. Moreover, the above silane coupling agent reacts with the resin ingredient of interlayer resin insulation layer 12 to chemically bond them. Accordingly, the coating film and interlayer resin insulation layer 12 bond securely. As a result, conductive circuit 14 and interlayer resin insulation layer 12 covering conductive circuit 14 adhere strongly by means of the metal layer and the coating film.

As such, in an embodiment of the present invention, a metal layer formed on the surface of a conductive circuit is preferred to be a metal layer containing Sn. The reason is thought to be as follows: Namely, a metal layer containing Sn is more suitable for adhering hydroxyl groups to its surface than Cu, which forms conductive circuits; and if hydroxyl groups are adhered, the metal easily bonds with a coupling agent. In addition, the reason for a layer containing Sn to adhere hydroxyl groups more easily to its surface than a layer containing Cu is thought to be that the isoelectric point of an Sn oxide ($SnO_2$) is 4.3, which is lower than the isoelectric point 9.5 of a Cu oxide (CuO). Generally, a metal oxide with a low isoelectric point tends to adhere hydroxyl groups easily to its surface. Considering such, a multilayer printed wiring board according to an embodiment of the present invention is preferred to use for its metal layers a metal whose oxide has an isoelectric point of 5 or less.

In a multilayer printed wiring board according to an embodiment of the present embodiment, a metal layer is formed on a conductive circuit made of copper by performing tin displacement plating as described later in a manufacturing method. The above metal layer contains Sn and Cu. Furthermore, when forming a metal layer, parts of Sn and Cu are oxidized inevitably, thus it is thought that $SnO_2$ and CuO are contained in the metal layer.

Also, in multilayer printed wiring board 10, the top surface of inner-layer conductive circuit 14 and the entire bottom portions of via conductors 17 are directly connected. Namely, there is no metal layer or coating film between conductive circuit 14 and via conductors 17. As such, in a case where conductive circuit 14 and via conductors 17 are formed with the same kind of metal (it is usually copper), if there is no metal layer or coating film between conductive circuit 14 and via conductors 17, their connectivity (adhesiveness) and electrical characteristics are excellent since there is no foreign metal in between. Furthermore, in multilayer printed wiring board 10, the surfaces of conductive circuit 14 are not roughened and thus are substantially flat. Accordingly, signal transmissions are seldom delayed.

Next, a method for manufacturing a multilayer printed wiring board according to the first embodiment is described in the order of steps.

(1) Insulative substrate 11 is prepared as a starting material, and then conductive circuits 14 are formed on insulative substrate 11 (see FIGS. 2A-2F). The above insulative substrate is not limited to any specific type, but, for example, glass-epoxy substrates, bismaleimide-triazine (BT) resin substrates, copper-clad laminates, resin substrates such as an RCC substrate, ceramic substrates such as an aluminum-nitride substrate, silicon substrates and others may be used. The above conductive circuits may be formed by, for example, forming a plain copper conductive layer by electroless copper plating performed on the surfaces of the above insulative substrate followed by electrolytic copper plating, then by etching the layer. In this step, through-hole conductors 19 may be formed to connect between conductive circuits 14 sandwiching insulative substrate 11. Also, after conductive circuits are formed, the surfaces of the conductive circuits may be roughened by etching or the like, according to requirements.

(2) Next, on the entire exposed surfaces (top and side surfaces) of conductive circuit 14, a metal layer containing Sn is formed. The metal layer containing Sn may be formed by, for example, tin displacement plating, electroless tin plating, electrolytic tin plating, immersion in a molten-tin bath or the like. Among those, tin displacement plating is preferred, since the thickness of the plated film may be easily adjusted. As for the plating solution used in such tin displacement plating, for example, a mixed solution of tin bistetrafluoroborate and thiourea or the like is listed. When tin displacement plating is performed on a conductive circuit made of copper, a layer made of Sn (hereinafter also referred to as an Sn layer) and an Sn—Cu compound layer (hereinafter also referred to as an Sn—Cu layer) are formed in that order from the surface-layer side on the surface of the conductive circuit. In addition, after forming metal layers in such a method, the Sn layer may be removed by etching to expose the Sn—Cu layer, according to requirements. The remaining Sn—Cu layer forms the metal layer. Here, the step to remove the Sn layer is optional.

Also, hydroxyl groups are adhered to the surface of the metal layer formed as above. Here, the reason for hydroxyl groups to easily adhere to a metal layer containing Sn is as described above. Such hydroxyl groups adhere to a metal layer through water molecules attached to the metal surface without any specific treatment. However, hydroxyl groups may also be applied on a metal layer surface by means of a specific treatment. As for the first method to apply hydroxyl groups on a metal layer surface, for example, a method is listed in which the surface of a conductive circuit is treated using metal alkoxide. As for such metal alkoxide, sodium methoxide ($CH_3ONa$), sodium ethoxide ($C_2H_5ONa$), lithium ethoxide ($C_2H_5OLi$) or the like are listed. Hydroxyl groups may be adhered by immersing the printed wiring board in a metal alkoxide solution, or by spraying such a solution on the surfaces of conductive circuits. Also, as for the second method, for example, a method is listed in which the surfaces of conductive circuits are treated by an alkali. As for the above alkali, for example, sodium hydroxide, potassium hydroxide, sodium methoxide or the like are listed. Hydroxyl groups may be adhered by immersing the printed wiring board in such an alkaline solution, or by spraying such an alkaline solution on the surfaces of conductive circuits.

Furthermore, as for the third method, for example, a humidifying treatment or a steam treatment may be conducted on the conductive circuits.

Figure 2:
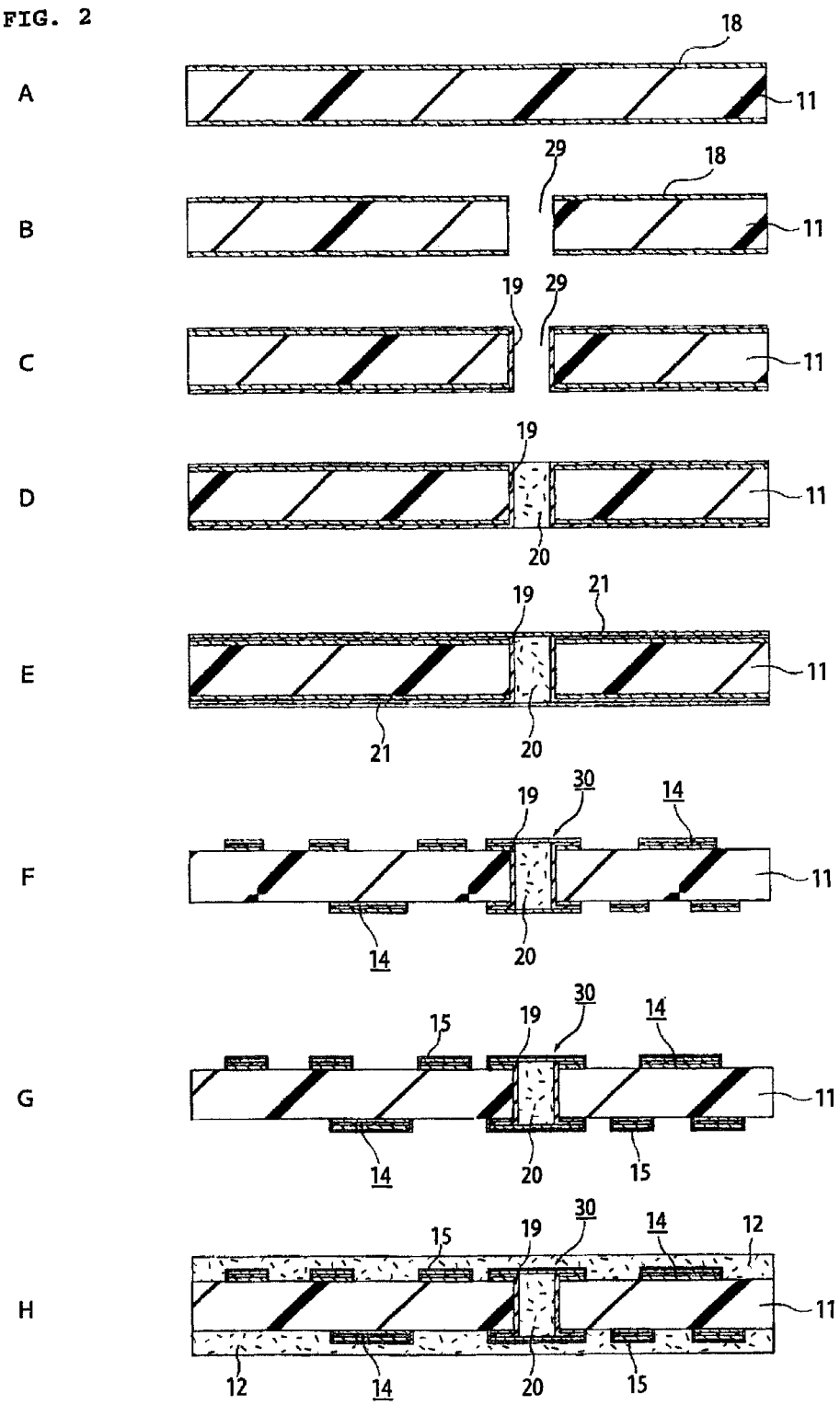
FIGS. 2A-2H are cross-sectional views schematically showing a method for manufacturing the multilayer printed wiring board according to the first embodiment.

(3) Next, a coating film made of a silane coupling agent is formed on the above metal layer (see FIG. 2G). In FIG. 2G, a metal layer and a coating film of silane coupling agent are altogether referred to as conductive-circuit coating layer 15. Here, when forming a coating film, for example, a solution containing a silane coupling agent is sprayed on the surfaces of the conductive circuit and then dried. Preferably, a later-described interlayer resin insulation layer and a silane coupling agent are selected in such a combination that the functional groups of the interlayer resin insulation layer will chemically react with the functional groups of the silane coupling agent when heat is added. For example, when an epoxy group is contained in an interlayer resin insulation layer, if an amino-functional silane is selected as the silane coupling agent, notable adhesiveness will be achieved between them. That is thought to be because an epoxy group and an amino group easily form a strong chemical bond when heat is added to form the interlayer resin insulation layer, and such a bond is extremely stable against heat or water.

(4) Next, on insulative substrate 11 where conductive circuit 14 is formed, interlayer resin insulation layer 12 is formed. Opening portions 16 are formed in interlayer resin insulation layer 12 to reach the coating film on conductive circuit 14, then the coating film and the metal layer beneath the coating film (conductive-circuit coating layer 15) are removed (see FIGS. 2H and 3A). The above interlayer resin insulation layer may be formed using a thermosetting resin, a photosensitive resin, a thermosetting resin part of which is photosensitive, a resin compound of such resins and thermoplastic resin. Specifically, a resin layer is formed by applying an uncured resin using a roll coater, curtain coater or the like, by thermopressing a resin film and so forth. After that, according to requirements, the resin is cured, and the above opening portions are formed by laser processing or by exposure and development. Also, a resin layer made of the above thermoplastic resin may be formed by thermopressing a resin film.

Also, to remove the above metal layer, for example, a method using a permanganic acid solution or the like may be employed. If a permanganic acid solution is used, a metal layer containing Sn may be completely removed. Furthermore, using a permanganic acid solution, a desmear treatment to remove resin residue remaining in the opening portions formed in an interlayer resin insulation layer may be conducted simultaneously when removing the metal layer. In a case where laser processing is conducted to form opening portions in the interlayer resin insulation layer, a desmear treatment to remove resin residue remaining in the opening portions formed in the interlayer resin insulation layer may be conducted at the same time as the metal layer is removed by using a permanganic acid solution.

Also, in the present step, when opening portions are formed in the interlayer resin insulation layer by laser processing, by exposure and development or the like, and/or when the metal layer is removed in the present step using a permanganic acid solution or the like, the coating film on the metal layer is removed along with the metal layer.

Figure 3:
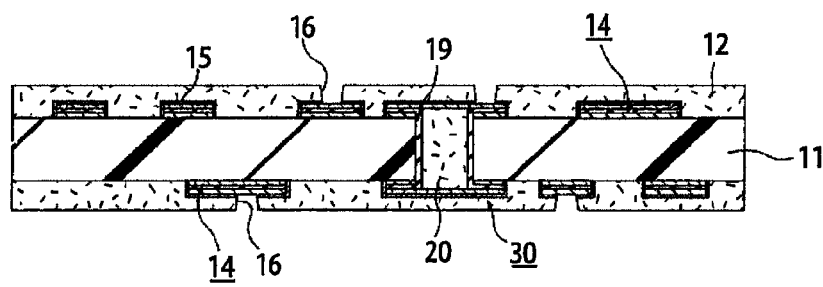
FIGS. 3A-3D are cross-sectional views schematically showing a method for manufacturing the multilayer printed wiring board according to the first embodiment.
Figure 3:
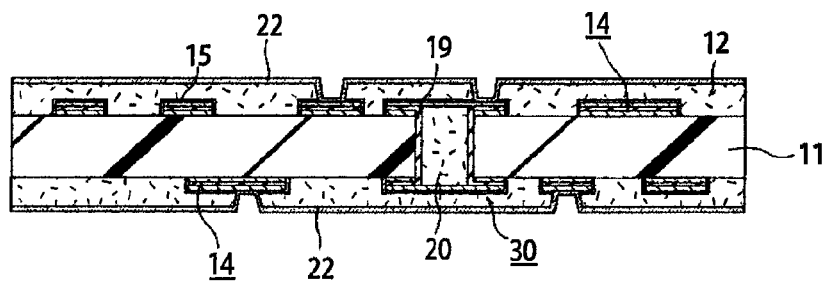
Figure 3:
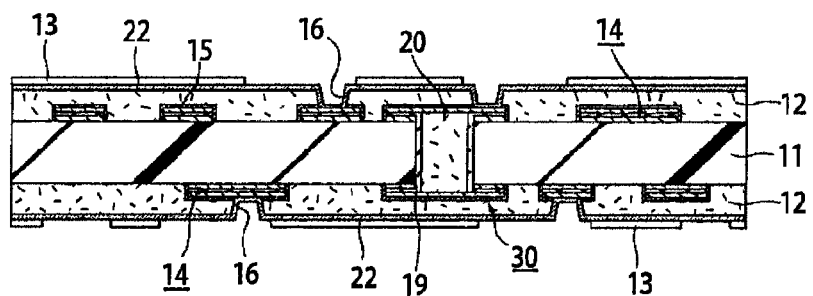
Figure 3:
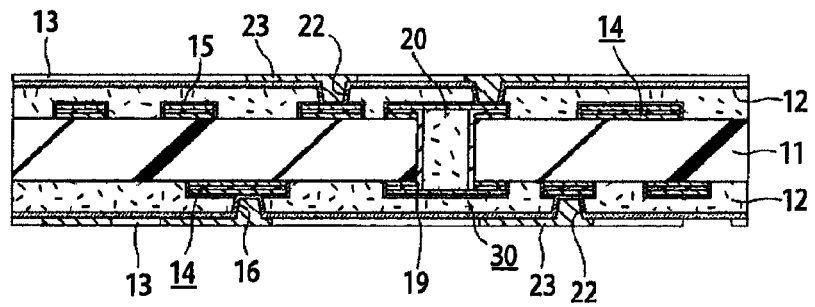

(5) Next, electroless copper-plated film 22 is formed on the surface of interlayer resin insulation layer 12 (including on the wall surfaces of opening portions 16) (see FIG. 3B). Here, the thickness of the electroless copper-plated film is preferred to be set in the range of 0.1 to 0.3 μm.

(6) Next, plating resist 13 is formed on electroless copper-plated film 22 (see FIG. 3C). The plating resist is formed in areas where conductive circuits and via conductors are not formed. Forming the plating resist is not limited to any specific method, but it may also be formed by, for example, laminating a photosensitive dry film, which is then exposed to light and developed.

(7) Next, electrolytic copper-plated film 23 is formed on electroless copper-plated film 22 in areas where the plating resist is not formed (see FIG. 3D). Here, the thickness of the electrolytic copper-plated film is preferred to be set in the range of 5 to 20 μm.

(8) Then, plating resist 13 on interlayer resin insulation layer 12 is removed. When removing the plating resist, for example, an alkaline solution or the like may be used.

Figure 4:
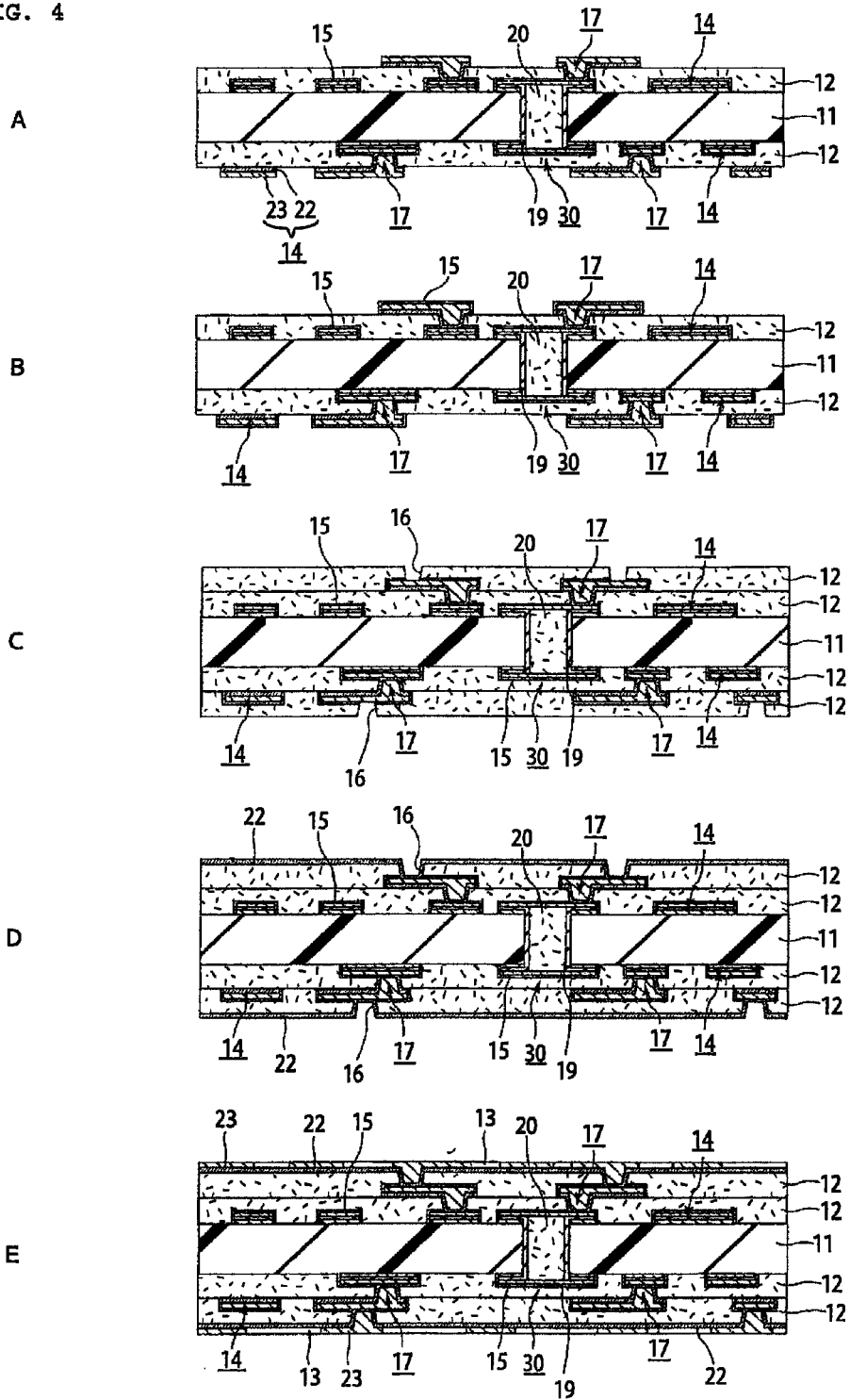
FIGS. 4A-4E are cross-sectional views schematically showing a method for manufacturing the multilayer printed wiring board according to the first embodiment.
Figure 5:
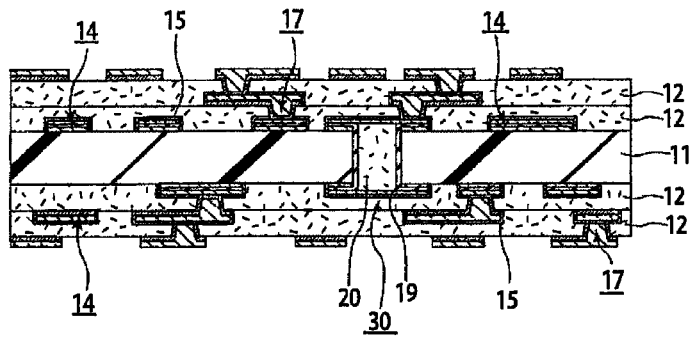
FIGS. 5A-5D are cross-sectional views schematically showing a method for manufacturing the multilayer printed wiring board according to the first embodiment.
Figure 5:
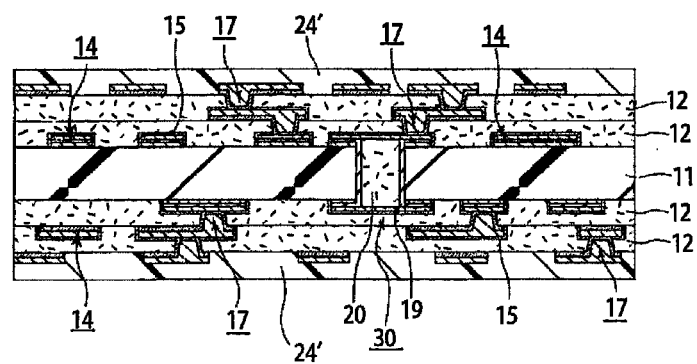
Figure 5:
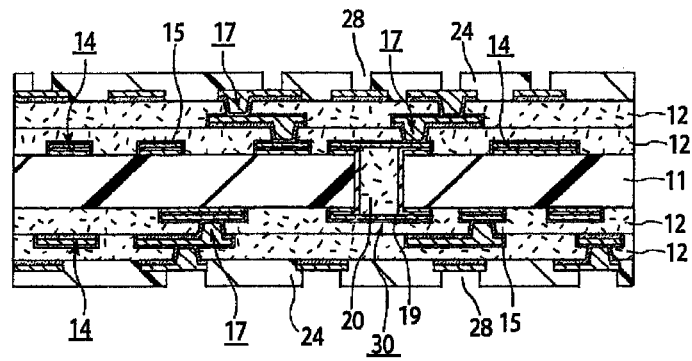
Figure 5:
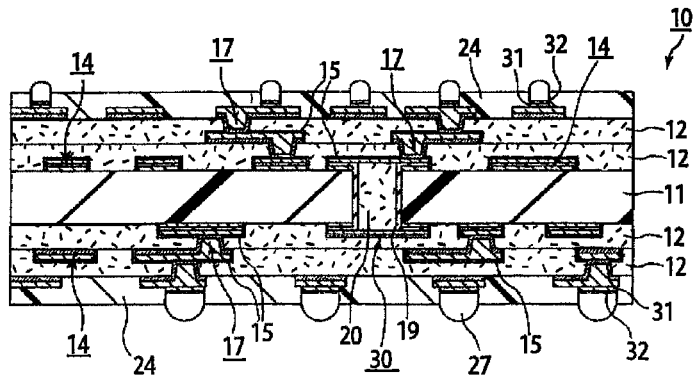

(9) Next, electroless copper-plated film 22, exposed after plating resist 13 was taken away, is removed (see FIG. 4A). Here, to remove the electroless copper-plated film, for example, an etching solution may be used. The unnecessary electroless copper-plated film (the electroless copper-plated film existing between electrolytic plated films) may be completely removed.

Through steps (5)-(9), a conductive circuit is formed on an interlayer resin insulation layer while forming via conductors to connect such a conductive circuit and the conductive circuit on the insulative substrate. Accordingly, conductive circuits and via conductors may be formed efficiently. After opening portions are formed in the interlayer resin insulation layer, the coating film and the metal layer are removed. By doing so, the connection between the conductive circuit on the insulative substrate and the via conductors is carried out between the same kinds of metal (copper to copper). Also, after forming the above conductive circuit, the catalyst on the interlayer resin insulation layer may be removed if necessary, using acid or an oxidizing agent. In doing so, deterioration of electrical characteristics may be prevented. In the above steps (1)-(7), insulative substrate 11 is also referred and/or corresponds to the first interlayer resin insulation layer.

(10) In addition, by repeating the above steps (2)-(9) according to requirements, interlayer resin insulation layers and conductive circuits may further be formed while forming via conductors (see FIGS. 4B-5A). Namely, build-up layers may further be laminated where interlayer resin insulation layers 12 and conductive circuits 14 are alternately laminated. When conducting step (10), the interlayer resin insulation layer formed in step (4) corresponds to the first interlayer resin insulation layer, and the interlayer resin insulation layer formed in step (10) corresponds to the second interlayer resin insulation layer.

(11) Lastly, solder resist layer 24 and solder bumps 27 are formed to complete multilayer printed wiring board 10 (see FIGS. 5B-5D). Specifically, on the uppermost interlayer resin insulation layer including the conductive circuit, solder-resist composition is applied using a roll coater method or the like, which is then cured according to requirements. At the same time, opening portions are formed by laser processing, exposure and development or the like. Accordingly, a solder resist layer is formed. After that, solder bumps are formed in the opening portions of the solder resist layer. Also, in the present step, after forming opening portions in the solder resist layer, a protective layer is formed to protect the conductive circuit (solder pads) exposed through the opening portions. The protective layer may be formed with one layer or with two or more layers. As for the material for such a protective layer, gold, nickel, palladium or any such compound may be listed.

In the following, the effects of a multilayer printed wiring board according to the first embodiment and a method for manufacturing the multilayer printed wiring board are listed.

(1) In a multilayer printed wiring board of the first embodiment, a metal layer is formed on the surface of the first conductive circuit, and a coating film made of a silane coupling agent is further formed on the metal layer. Accordingly, the conductive circuit and the interlayer resin insulation layer are securely bonded through the metal layer and the coating film. At the same time, the conductive circuit is directly connected to the bottom portions of via conductors connected to the conductive circuit. Namely, a metal layer rarely exists between the conductive circuit and the via conductors. By directly connecting a conductive circuit and via conductors, connection reliability between the conductive circuit and the via conductors may be enhanced. Furthermore, electrical resistance may be reduced between the two. Here, to reduce the electrical resistance between a conductive circuit and via conductors while enhancing adhesiveness between the conductive circuit and the via conductors, it is preferred that the entire bottom portions of the via conductors be directly connected to the conductive circuit underneath them. Namely, the metal layer is preferred not to exist at all between a conductive circuit and via conductors.

(2) In a multilayer printed wiring board according to the first embodiment, a metal layer containing Sn is used for the above metal layer. Accordingly, adhesiveness between a conductive circuit and an interlayer resin insulation layer by means of the metal layer and a coupling agent is enhanced.

(3) In a multilayer printed wiring board according to the first embodiment, electrolytic plated film to form a conductive circuit and electroless plated film to form via conductors arranged on the conductive circuit are both made of copper. Accordingly, the connection between a conductive circuit and via conductors is carried out between the same kind of metal, thus lowering electrical resistance between the conductive circuit and the via conductors. Therefore, the multilayer printed wiring board has excellent electrical characteristics. Namely, adhesiveness between conductive circuits and interlayer resin insulation layers is secured while excellent electric characteristics are maintained.

(4) In a multilayer printed wiring board according to the first embodiment, the surfaces of conductive circuits are not roughened, but are substantially flat. Accordingly, signal transmission delays due to the skin effect seldom occur, and electrical characteristics are excellent.

(5) The method for manufacturing a multilayer printed wiring board according to the first embodiment may be used preferably to manufacture a multilayer printed wiring board of the first embodiment. In a multilayer printed wiring board of the first embodiment, a metal layer containing Sn is removed using a permanganic acid solution. Thus, the metal layer at the bottoms of the opening portions formed in an interlayer resin insulation layer may be completely removed. Also, by using the permanganic acid solution, a desmear treatment may simultaneously be carried out to remove the resin residue remaining when the opening portions were formed in the interlayer insulation layer, while removing the metal layer (Sn—Cu layer).

(6) In a method for manufacturing a multilayer printed wiring board according to the first embodiment, a conductive circuit on an interlayer resin insulation layer and via conductors that penetrate the interlayer resin insulation layer are formed simultaneously. In doing so, manufacturing processes are simplified.

In the following, the first embodiment is further described in detail referring to examples. However, the embodiment of the present invention is not limited only to such examples.

Example 1

(A) Preparation of Resin Filler

The following were put in a container and mixed by blending them to prepare a resin filler with a viscosity of 45-49 Pa·s at 23±1° C.: bisphenol F-type epoxy monomer (YL983U, molecular weight=310, made by Japan Epoxy Resins Co., Ltd.) 100 parts by weight; $SiO_2$ spherical particles whose surfaces are coated with a silane coupling agent, and whose average particle diameter is 1.6 µm and maximum particle diameter is 15 µm or smaller (CRS 1101-CE made by Atotec Japan) 170 parts by weight; and a leveling agent (Perenol S4, made by San Nopco Limited) 1.5 parts by weight. As a curing agent, an imidazole curing agent (2E4MZ-CN, made by Shikoku Chemicals Corporation) 6.5 parts by weight, was used.

(B) Manufacturing a Multilayer Printed Wiring Board (1) A copper-clad laminate shown in FIG. 2A, in which copper foil 18 with a thickness of 18 µm was laminated on both surfaces of insulative substrate 11 made of 0.8 mm-thick glass epoxy resin, was used as a starting material. Next, as shown in FIG. 2B, the copper-clad laminate was drilled to form penetrating holes 29 for through-hole conductors.

Next, as shown in FIG. 2C, on copper foil 18 and the inner-wall surfaces of penetrating holes 29, electroless copper plating and electrolytic copper plating were performed to form a conductive layer including through-hole conductors 19 which were made up of electroless copper-plated film and electrolytic copper-plated film on the electroless copper-plated film.

(2) Next, the substrate with through-hole conductors 19 was washed with water and dried. Then, a black oxide treatment was conducted using a solution as a black oxide bath (oxidation bath) which contains NaOH (10 g/L), $NaClO_2$ (40 g/L) and $Na_3PO_4$ (6 g/L), followed by a reduction treatment using a solution as a reduction bath which contains NaOH (10 g/L) and $NaBH_4$ (6 g/L). Accordingly, the surfaces of through-hole conductors 19 were roughened (not shown in the drawings).

(3) Next, as shown in FIG. 2D, the resin filler described in (A) above was filled inside through-hole conductors 19 under the following process. Namely, the resin filler was squeezed into through-hole conductors 19 using a squeegee, and dried under conditions of 100° C. for 20 minutes. Then, one side of the substrate was belt-sanded using a #600 belt polishing paper (made by Sankyo-Rikagaku Co., Ltd.) so that the resin filler does not remain on the electrolytic copper-plated film. Then, the substrate was buff-sanded to remove scratches left by the above belt-sander polishing. Such a series of polishing was also conducted on the other surface of the substrate. Then, heat treatments were conducted at 100° C. for an hour, at 120° C. for three hours, at 150° C. for an hour, and at 180° C. for seven hours to form resin filler layers 20.

(4) Next, as shown in FIG. 2E, conductive layer 21 made up of electroless copper-plated film and electrolytic copper-plated film was formed on the electrolytic copper-plated film and on resin filler layers 20. Then, as shown in FIG. 2F, conductive circuit 14 was formed on insulative substrate 11 using a subtractive method. During that time, conductive circuit 30 covering resin filler layers 20 was also formed.

(5) Next, the substrate with conductive circuit 14 was immersed in a 10% sulfuric acid solution for 10 seconds, which was washed with water and dried without air flow.

(6) Next, in a tin displacement plating solution containing tin bistetrafluoroborate 0.1 mol/L and thiourea 1 mol/L with an adjusted pH of approximately 1.2 using fluoroboric acid, the substrate was immersed under the conditions of approximately 30° C. for about 30 seconds. Then, the substrate was washed with water for approximately 30 seconds, and dried without air flow. In this plating treatment, an Sn—Cu layer and an Sn layer were formed in that order on the surface of conductive circuit 14. The thickness of the Sn—Cu layer was approximately in the range of 5 to 10 nm and that of the Sn layer was approximately 50 nm.

(7) Next, the substrate was immersed in a 1% nitric-acid solution for 10 seconds and then washed with water for 20 seconds. By such a treatment, the Sn layer was removed and the Sn—Cu layer was exposed.

(8) Next, a solution of γ-amino propyltriethoxysilane (KBE-903, made by Shin-Etsu Chemical Co., Ltd.) with an adjusted concentration of 1 weight percent was sprayed on conductive circuit 14 (on the Sn—Cu layer). Then, the substrate was dried at 90-120° C. for 30-150 seconds and washed with water to remove the excess silane coupling agent. In doing steps (5)-(8), conductive-circuit coating layer 15, which was made up of a metal layer containing Sn and a coating film made of a silane coupling agent, was formed on conductive circuit 14 (see FIG. 2G).

(9) Next, as shown in FIG. 2H, interlayer resin insulation layer 12 was formed on insulative substrate 11 and conductive circuits 14, 30 using an interlayer resin insulation film (ABF, made by Ajinomoto Fine-Techno Co., Inc.). Namely, interlayer resin insulation film was laminated on the substrate under the conditions of vacuum degree 65 Pa, pressure 0.4 MPa, temperature 80° C. and time 60 seconds, then thermoset at 170° C. for 30 minutes.

(10) Next, opening portions 16 with a diameter of approximately 60 μm were formed using a $CO_2$ gas laser in interlayer resin insulation layer 12. As a result, the Sn—Cu layer was exposed at the bottoms of opening portions 16.

(11) Next, the substrate with opening portions 16 was immersed in an 80° C.-solution containing permanganic acid 5-6 g/L for 15 minutes. In doing so, the Sn—Cu layer was removed and conductive circuit 14 was exposed at the bottoms of opening portions 16 (see FIG. 3A). Then, after the above treatment the substrate was immersed in a neutralizing solution (made by Shipley Company L.L.C.) and washed with water.

Next, after step (11) was finished, the bottoms of the opening portions were observed using an SEM, the formation elements of the exposed surfaces were analyzed, but no Sn peak was found. Therefore, in the above treatment using a permanganic acid solution, the Sn element was thought to be completely removed from the exposed surface.

(12) Next, a palladium catalyst (not shown in the drawings) was applied on the surface of interlayer resin insulation layer 12 (including the inner-wall surfaces of opening portions 16). Then, the substrate with the palladium catalyst was immersed in an electroless copper plating solution (MF-390, made by Nippon MacDermid Co., Inc., Ltd.) using sodium hypophosphite as a reduction agent. Accordingly, electroless copper-plated film 22 with a thickness in the range of 0.1 to 0.3 μm was formed on the surface of interlayer resin insulation layer 12 (including the inner-wall surfaces of opening portions 16) (see FIG. 3B). The electroless copper plating conditions were solution temperature 75° C. and four minutes.

(13) Next, a commercially available photosensitive dry film was laminated on electroless copper-plated film 22, and a mask was placed thereon, which was then exposed to light and developed. Accordingly, plating resist 13 with a thickness of 25 μm was arranged (see FIG. 3C).

(14) Next, the substrate with plating resist 13 was washed with 50° C. water to remove grease, washed with 25° C. water and further washed with sulfuric acid. Then electrolytic plating was performed under the following conditions to form electrolytic copper-plated film 23 with a thickness of 20 μm in areas where plating resist 13 was not formed (see FIG. 3D).

| [electrolytic copper plating solution] | |
| --- | --- |
| sulfuric acid | 150 g/L |
| copper sulfate | 150 g/L |
| chloride ion | 8 mg/L |
| additives | 4 ml/L |
| (Top Lucina NSV-1, made by Okuno Chemical Industries Co., Ltd.) | 0.5 ml/L |
| (Top Lucina NSV-2, made by Okuno Chemical Industries Co., Ltd.) | 1 ml/L |
| (Top Lucina NSV-3, made by Okuno Chemical Industries Co., Ltd.) | |
| [electrolytic plating conditions] | |
| current density | 1 A/dm$^2$ |
| time | 90 minutes |
| temperature | 23° C. |

(15) Next, plating resist 13 was removed. In the following, electroless copper-plated film 22 between adjacent electrolytic copper-plated films was etched away using a mixed solution of sulfuric acid and hydrogen peroxide. In doing so, 18 μm-thick conductive circuit 14 and via conductors 17 were formed, which were made up of electroless copper-plated film 22 and electrolytic copper-plated film 23 formed on electroless copper-plated film 22 (see FIG. 4A).

(16) Next, using the same process as in steps (5)-(8), conductive-circuit coating layer 15 made up of a metal layer containing Sn and a coating film made of a silane coupling agent was formed on conductive circuit 14 (including via conductors 17) positioned on interlayer resin insulation layer 12 (see FIG. 4B).

(17) Next, using the same process as in steps (9)-(15), interlayer resin insulation layer 12 and conductive circuit 14 (including via conductors 17) were formed (see FIGS. 4C-5A).

(18) Next, as shown in FIG. 5B, on outermost interlayer resin insulation layer 12 and conductive circuit 14, a commercially available solder-resist composition was applied to be 30 μm thick and dried under conditions of 70° C. for 20 minutes and 70° C. for 30 minutes. Accordingly, solder-resist composition layer 24' made of a commercially available composition was formed.

(19) Next, as shown in FIG. 5C, a 5 mm-thick photomask with an opening pattern of solder-bumps was adhered onto solder-resist composition layer 24', which was then exposed to ultraviolet rays at 1000 mJ/cm$^2$ and developed in a DMTG solution. Accordingly, solder-bump openings 28 were formed. Furthermore, solder-resist composition layer 24' was cured through heat treatments conducted under conditions of 80° C. for an hour, 100° C. for an hour, 120° C. for an hour and 150° C. for three hours. Solder-resist layer 24 (20 μm thick) having solder-bump openings 28 was formed.

(20) Next, the substrate with solder-resist layer 24 was immersed for 20 minutes in an electroless nickel plating solution of pH=4.5 containing nickel chloride ($2.3 \times 10^{-1}$ mol/L), sodium hypophosphite ($2.8 \times 10^{-1}$ mol/L), sodium citrate ($1.6 \times 10^{-1}$ mol/L), and a 5 μm-thick nickel-plated layer (protective layer 31) was formed in solder-bump openings 28. Furthermore, the substrate was immersed for 7.5 minutes at 80° C. in an electroless gold plating solution containing gold potassium cyanide ($7.6 \times 10^{-3}$ mol/L), ammonium chloride ($1.9 \times 10^{-1}$ mol/L), sodium citrate ($1.2 \times 10^{-1}$ mol/L), sodium hypophosphite ($1.7 \times 10^{-1}$ mol/L), and a 0.03 μm-thick gold-plated layer (protective layer 32) was formed on the nickel-plated layer.

(21) Next, solder paste was printed in solder-bump openings 28 formed in solder-resist layer 24 and reflowed at 200° C. Accordingly, solder bumps 27 were formed and multilayer printed wiring board 10 was completed (see FIG. 5D).

Examples are listed below using a different metal layer to replace a metal layer containing Sn.

Example 2

In Example 2, electroless Ni plating is performed instead of Sn displacement plating in Example 1, and an Ni layer is formed on the surface of conductive circuit 14. Then, above steps (8)-(21) are conducted.

Example 3

In Example 3, Pd displacement plating is performed instead of Sn displacement plating in Example 1. Namely, the substrate with conductive circuit 14 is immersed for a predetermined time in a Pd displacement plating bath to form a Pd layer. Then, above steps (8)-(21) are conducted.

Example 4

In Example 4, Au displacement plating is performed instead of Sn displacement plating in Example 1. Namely, the substrate with conductive circuit 14 is immersed for a predetermined time in an Au displacement plating bath to form an Au layer. Then, above steps (8)-(21) are conducted.

Example 5

In Example 5, electroless Ag plating is performed instead of Sn displacement plating in Example 1, and an Ag layer is formed on the surface of conductive circuit 14. Then, above steps (8)-(21) are conducted.

Example 6

In Example 6, electroless Pt plating is performed instead of Sn displacement plating in Example 1, and a Pt layer is formed on the surface of conductive circuit 14. Then, above steps (8)-(21) are conducted.

Example 7

In Example 7, Zn plating is performed instead of Sn displacement plating in Example 1, and a Zn layer is formed on the surface of conductive circuit 14. Then, above steps (8)-(21) are conducted.

Example 8

In Example 8, a Co layer is formed on the surface of conductive circuit 14 by sputtering instead of Sn displacement plating in Example 1. Then, above steps (8)-(21) are conducted.

Example 9

In Example 9, a Ti layer is formed on the surface of conductive circuit 14 by sputtering instead of Sn displacement plating in Example 1. Then, above steps (8)-(21) are conducted.

Comparative Example 1

A multilayer printed wiring board was manufactured in the same way as in Example 1, except that a metal layer containing Sn was not formed. Therefore, in the multilayer printed wiring board of Comparative Example 1, conductive circuit 14 and interlayer resin insulation layer 12 are connected without a metal layer but only through a coating film made of silane coupling agent.

Comparative Example 2

A multilayer printed wiring board was manufactured in the same way as in Example 1, except that a coating film made of silane coupling agent was not formed. Therefore, in the multilayer printed wiring board of Comparative Example 1, a metal layer containing Sn is formed on the surface of conductive circuit 14, and the metal layer and interlayer resin insulation layer 12 are connected without a silane coupling agent.

Comparative Example 3

A multilayer printed wiring board was manufactured in the same way as in Example 1, except that a treatment using a permanganate solution (a step to remove the metal layer containing Sn exposed at the bottoms of opening portions) was not conducted after opening portions were formed in interlayer resin insulation layer 12. Therefore, in the multilayer printed wiring board of Comparative Example 2, conductive circuit 14 and via conductor 17 are connected by means of a metal layer containing Sn.

Evaluation of Multilayer Printed Wiring Boards of Example 1 and Comparative Examples 1 and 2

(1) Evaluation of Adhesiveness between Conductive Circuits and Interlayer Resin Insulation Layers Regarding multilayer printed wiring boards of Example 1 and Comparative Examples 1 and 2, their peel strengths were measured at the initial stage and after humidity testing using the following method. The results are shown in Table 1.

<Initial Stage (Before Humidity Testing)>

Regarding multilayer printed wiring boards of Example 1 and Comparative Examples 1 and 2, their peel strengths were measured before conducting humidity testing. Peel strengths were measured using Autograph AGS50A (made by Shimadzu Corporation). Interlayer resin insulation layers were peeled from conductive circuits at a speed of approximately 10 mm/min.

<After Humidity Testing>

Regarding multilayer printed wiring boards of Example 1 and Comparative Examples 1 and 2, their peel strengths were measured the same as above after each printed wiring board was kept for 100 hours under conditions of 120-130° C. and humidity of 85%.

TABLE 1

|  | peel strength (N/cm) | |
| --- | --- | --- |
|  | initial stage | after humidity testing |
| Example 1 | 10.68 | 7.15 |
| Comp. Example 1 | 7.35 | 0 |
| Comp. Example 2 | 5.88 | 0 |

As shown in Table 1, excellent peel strength was not found in Comparative Example 1 where a coupling agent was directly applied on the surface of Cu, which forms a conductive circuit. Also, in Comparative Example 2 where an Sn—Cu alloy was connected to an interlayer resin insulation layer without applying a coupling agent, excellent peel strength was not found. On the contrary, in Example 1 where an Sn—Cu alloy was formed on the surface of a conductive circuit to be connected to an interlayer resin insulation layer by means of a coupling agent, excellent peel strength was found due to the combined effect of the Sn—Cu alloy and the coupling agent.

(2) Evaluation of Adhesiveness between Via Conductors and Conductive Circuits

Regarding multilayer printed wiring boards of Example 1 and Comparative Example 3, adhesiveness between via conductors and conductive circuits was evaluated using the following method. Namely, regarding multilayer printed wiring boards of Example 1 and Comparative Example 3, a process was repeated 200 times in which each printed wiring board was kept for 19 hours under conditions of 55° C. and humidity of 85%, then the temperature was raised to 260° C. Then, multilayer printed wiring boards were cross-cut to observe through a microscope the connected sections of their via conductors and conductive circuits. As a result, in Example 1, via conductors were securely connected to the surface of the conductive circuit underneath them and no peeling from the conductive circuit was found in the via conductors. On the other hand, in Comparative Example 3, peeling from the conductive circuit was found in the via conductors.

Second Embodiment

A multilayer printed wiring board according to the second embodiment is different from a multilayer printed wiring board of the first embodiment, as follows. Namely, a multilayer printed wiring board of the first embodiment is formed with an insulative substrate having through-hole conductors. However, a multilayer printed wiring board of the second embodiment is different from the multilayer printed wiring board of the first embodiment in that there is no insulative substrate.

Figure 6:
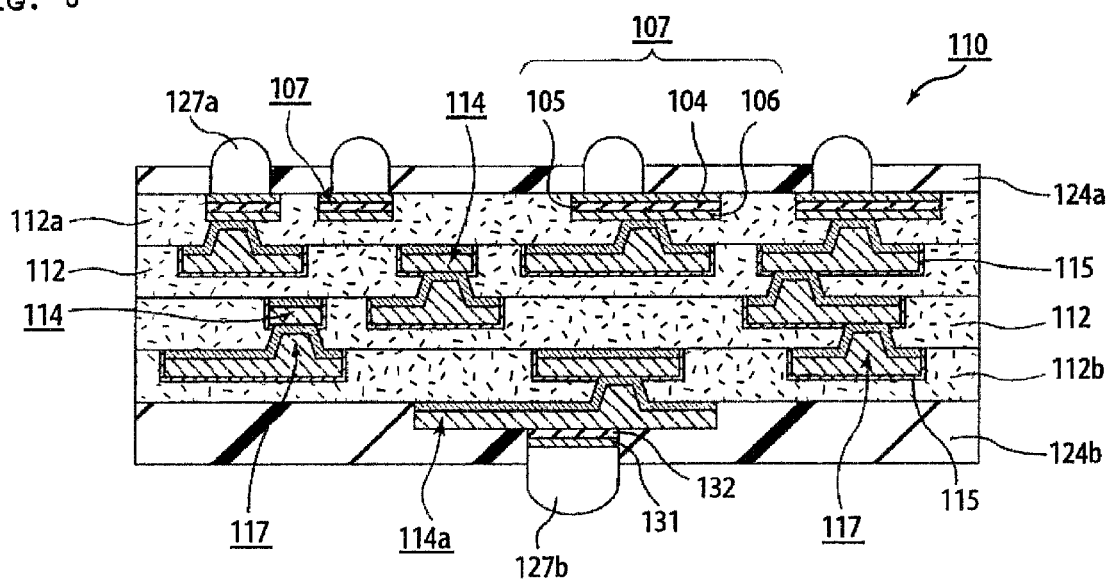
FIG. 6 is a cross-sectional view schematically showing a multilayer printed wiring board according to the second embodiment.

A multilayer printed wiring board according to the second embodiment is described with reference to FIG. 6. FIG. 6 is a cross-sectional view schematically showing a multilayer printed wiring board according to the second embodiment. In multilayer printed wiring board 110 of the second embodiment shown in FIG. 6, interlayer resin insulation layers 112 (including interlayer resin insulation layers (112a, 112b)) and conductive circuits 114 are laminated, and conductive circuits 114 sandwiching interlayer resin insulation layer 112 are electrically connected through via conductors 117. On interlayer resin insulation layer (112a) and component mounting pads 107 positioned at the outermost layer on one side, solder-resist layer 124 is formed. Solder bumps (127a) are formed on component mounting pads 107. Through solder bumps (127a), components such as a semiconductor chip are mounted on multilayer printed wiring board 110. Component mounting pads 107 are made up of protective layers 104, 105 and copper layer 106. On interlayer resin insulation layer (112b) positioned at the outermost layer on the other side and on conductive circuit (114a) formed on its surface, solder-resist layer (124b) is formed. On conductive circuit (114a) at the bottoms of opening portions formed in solder-resist layer (124b), solder bumps (127b) are formed by means of protective layers 132, 131.

Also, as shown in FIG. 6, in multilayer printed wiring board 110, the same as in multilayer printed wiring board 10 of the first embodiment, conductive circuits 114, (114a) are formed with electroless copper-plated film 122 and electrolytic copper-plated film 123. Here, among the conductive circuits, on parts of the surfaces of inner-layer conductive circuit 114, whose surfaces are in contact with an interlayer resin insulation layer, a metal layer containing Sn is formed (namely, on side surfaces of conductive circuit 114, and on the top surfaces of conductive circuit 114 (the surfaces which come in contact with via conductors 117) except the parts that touch the bottom portions of via conductors 117). A coating film made of a silane coupling agent is further formed on the metal layer (in FIG. 6, the metal layer and the coating film are referred to altogether as conductive-circuit coating layer 115). Also, via conductors 117 are connected to conductive circuit 114, and the entire bottom portions of via conductors 117 are directly connected to electrolytic copper-plated film 123, which forms conductive circuit 114. Namely, among top surfaces of conductive circuit 114, at the parts that touch the bottom portions of via conductors 117, the metal layer and coating film do not exist.

As described earlier, if a metal layer containing Sn is formed on the predetermined parts of conductive circuit 114 and a coating film made of a silane coupling agent is formed on the metal layer, conductive circuit 114 and interlayer resin insulation layer 112 will be securely adhered by means of the metal layer and the coating film.

Next, a method for manufacturing a multilayer printed wiring board according to the second embodiment is described in the order of steps.

Figure 7:
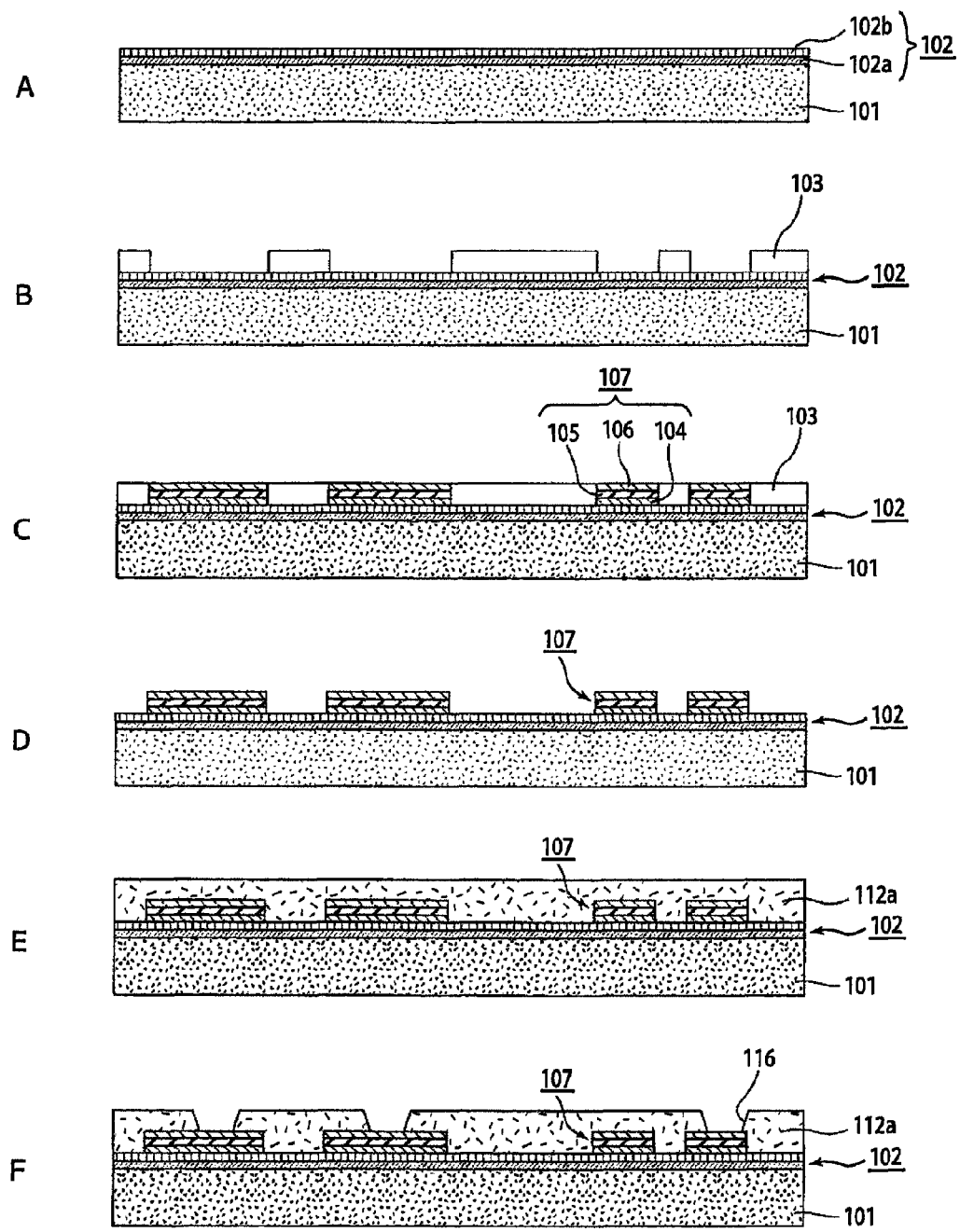
FIGS. 7A-7F are cross-sectional views schematically showing a method for manufacturing the multilayer printed wiring board according to the second embodiment.

(1) First, support plate 101 is prepared and seed layer 102 is formed on one side of the support plate (see FIG. 7A). For support plate 101, copper plate or the like may be used. Also, seed layer 102 is made up of multiple different metals. For example, on a surface of support plate 101, chrome layer (102a) is first formed, then copper layer (102b) is formed on chrome layer (102a) to obtain seed layer 102. To form chrome layer (102a) and copper layer (102b), electroless plating, sputtering, deposition or the like may be employed. Here, instead of chrome, any metal may be used that can be etched by an etching solution used for etching the metal that forms support plate 101, but its etching speed is remarkably slow.

(2) Next, plating resist 103 is formed on seed layer 102 (see FIG. 7B). The plating resist is formed in areas where component mounting pads will not be formed in the later step. Forming the plating resist is not limited to any specific method, but for example, it may be formed by laminating a photosensitive dry film, which is then exposed to light and developed.

(3) In areas where the plating resist is not formed, component mounting pads 107 are formed with protective layers 104, 105 and copper layer 106, which are positioned in that order from the seed-layer side; and each layer is formed by electrolytic plating (see FIG. 7C). The number of protective layers is not limited to two; it may be one or three or more. As for the material of the protective layers, gold, nickel, palladium or any such compound may be listed. In addition, the copper layer or the protective layers may be formed by a method other than electrolytic plating, namely, by sputtering, deposition or the like.

(4) After that, plating resist 103 on seed layer 102 is removed (see FIG. 7D). To remove the plating resist, for example, an alkaline solution or the like may be used.

(5) Next, interlayer resin insulation layer (112a) is formed on seed layer 102 while opening portions 116 reaching component mounting pads 107 are formed in interlayer resin insulation layer (112a) (see FIGS. 7E and 7F). The above interlayer resin insulation layer may be formed using a thermosetting resin, a photosensitive resin, a thermosetting resin part of which is photosensitive, a resin compound of such resins and thermoplastic resin. Specifically, a resin layer is formed by applying an uncured resin using a roll coater, curtain coater or the like, by thermopressing a resin film and so forth. After that, according to requirements, the resin layer is cured and the above opening portions are formed therein by means of laser processing or exposure and development. Accordingly, an interlayer resin insulation layer with opening portions is formed.

(6) Next, the same as in steps (5)-(9) of the method for manufacturing a multilayer printed wiring board according to the first embodiment, conductive circuit 114 is formed on interlayer resin insulation layer (112a); also formed are via conductors 117 that connect conductive circuit 114 on the interlayer resin insulation layer and component mounting pads 107 (see FIGS. 8A-8D).

Figure 8:
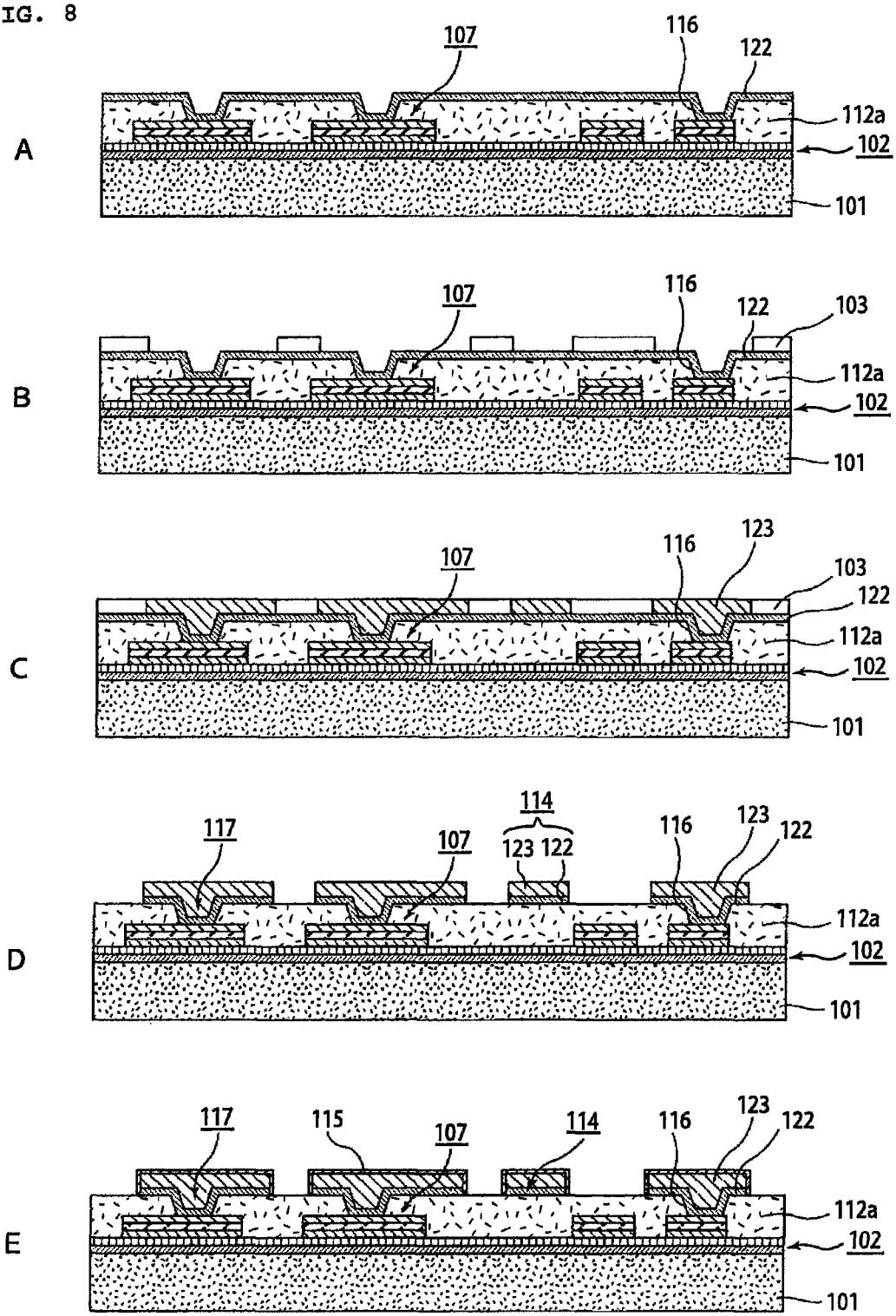
FIGS. 8A-8E are cross-sectional views schematically showing a method for manufacturing the multilayer printed wiring board according to the second embodiment.
Figure 9:
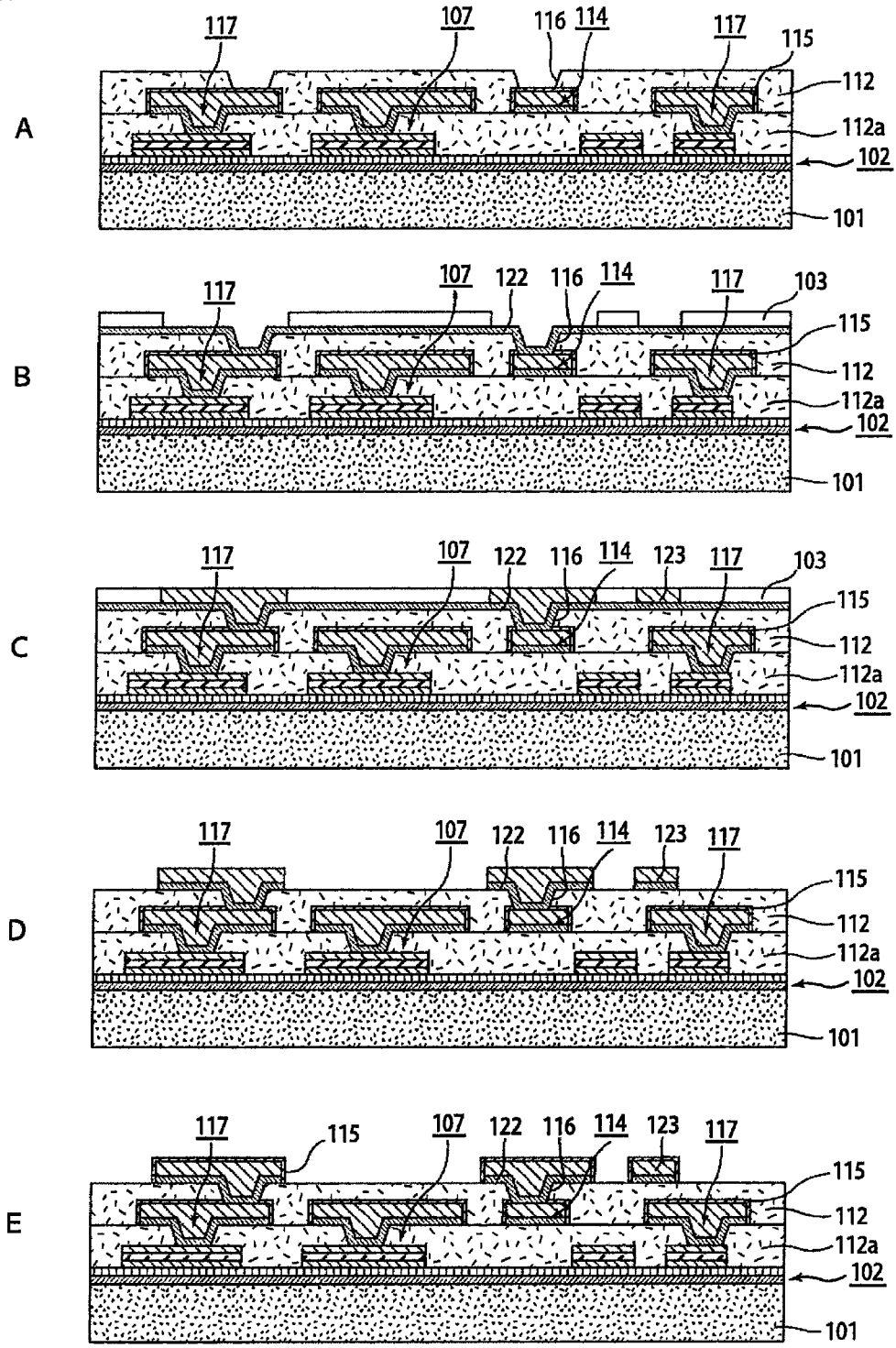
FIGS. 9A-9E are cross-sectional views schematically showing a method for manufacturing the multilayer printed wiring board according to the second embodiment.

(7) Next, on the surfaces of conductive circuit 114 and via conductors 117 formed in the above step (6), a metal layer containing Sn and a coating film made of a silane coupling agent (which are altogether referred to as conductive-circuit coating layer 115) are formed using the same processes as steps (2) and (3) in the method for manufacturing a multilayer printed wiring board according to the first embodiment (see FIG. 8E).

(8) Next, according to requirements, the above steps (5)-(7) are repeated to laminate interlayer resin insulation layer 112 and conductive circuit 114 (see FIGS. 9A-9E). Here, while repeating steps (5)-(7), opening portions 116 that reach conductive circuit 114 are arranged when an interlayer resin insulation layer is formed. Namely, the metal layer containing Sn is removed so as to expose conductive circuit 114 at the bottoms of opening portions 116. To remove the metal layer, a permanganic acid solution or the like may be used.

Figure 10:
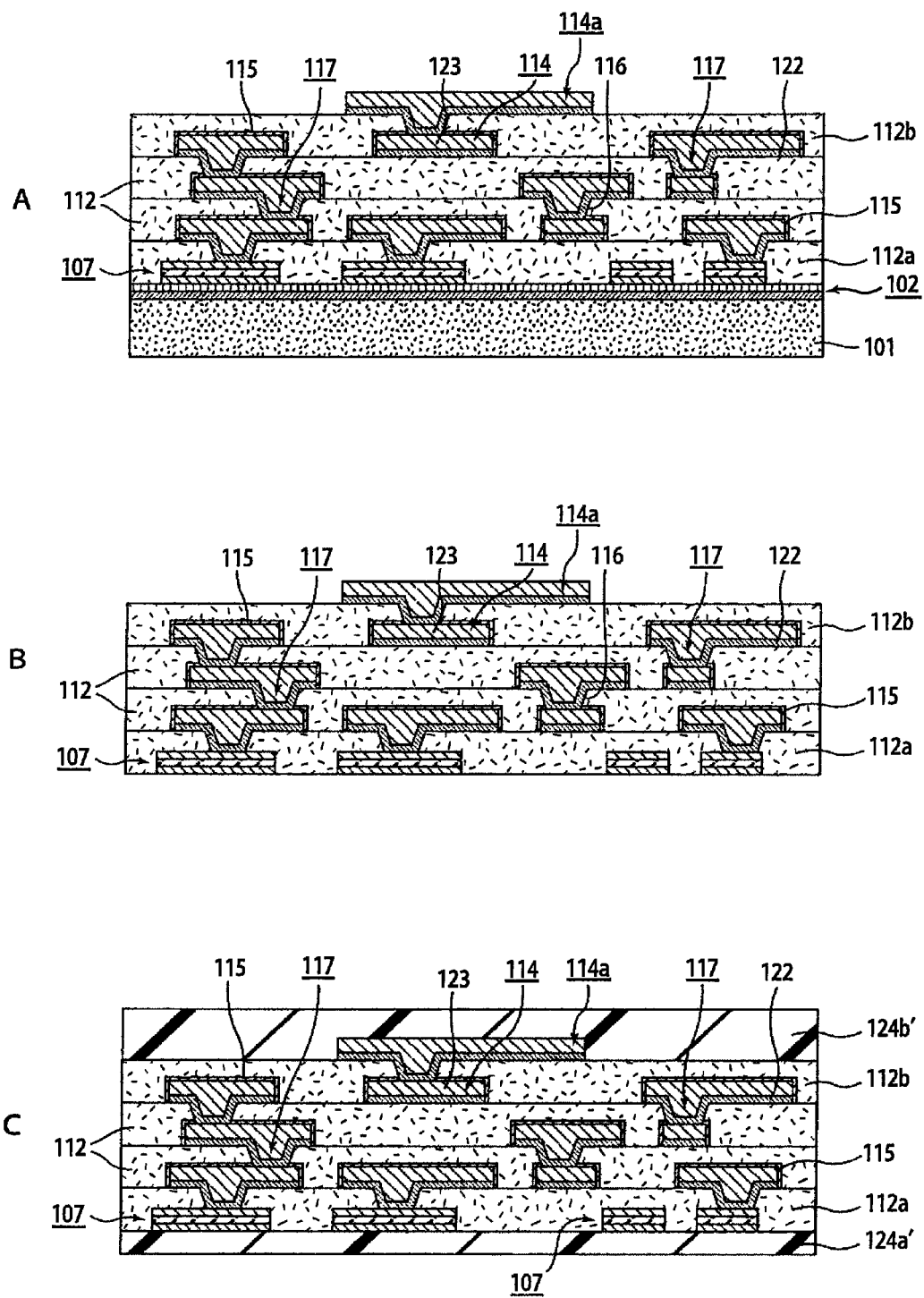
FIGS. 10A-10C are cross-sectional views schematically showing a method for manufacturing the multilayer printed wiring board according to the second embodiment.
Figure 11:
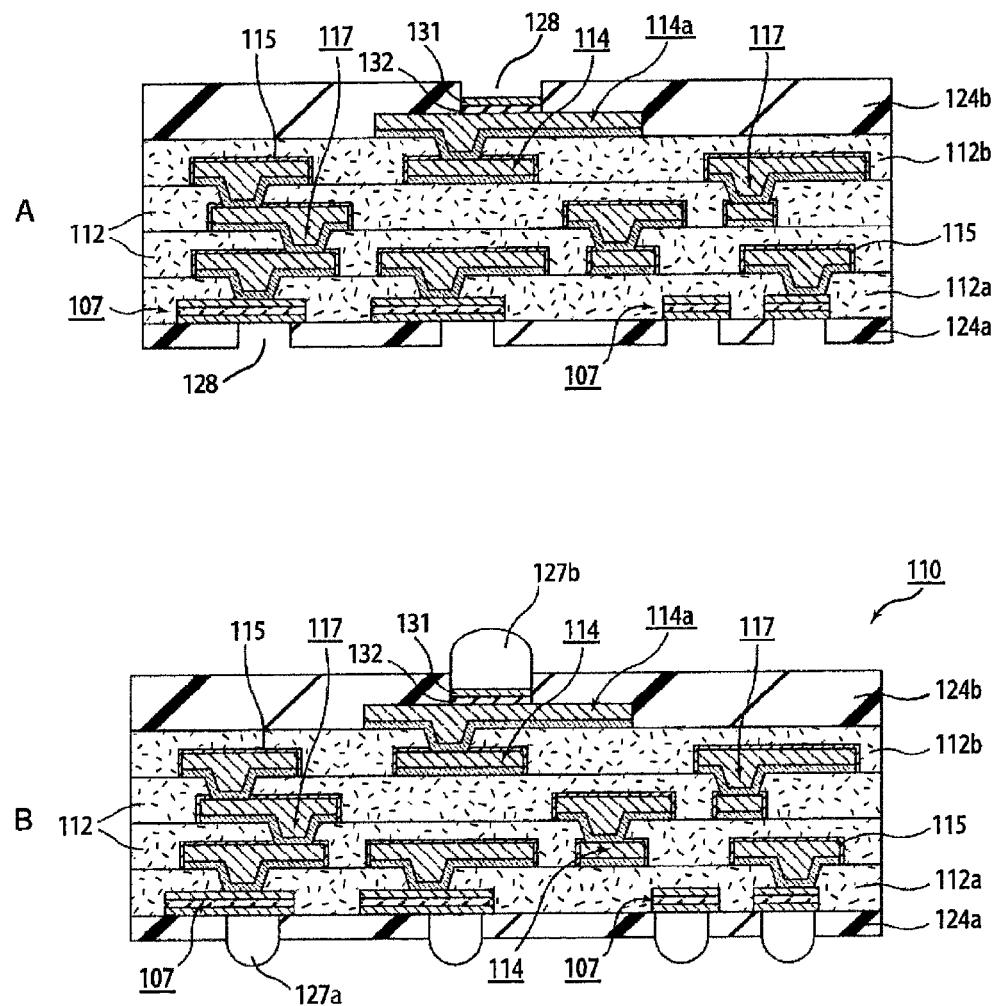
FIGS. 11A-11B are cross-sectional views schematically showing a method for manufacturing the multilayer printed wiring board according to the second embodiment.

(9) Next, the above steps (5) and (6) are repeated again to form outermost interlayer resin insulation layer (112a) and conductive circuit (114a) (see FIG. 10A).

(10) Next, support plate (101) is removed by etching. At that time, etching the copper that forms the support plate stops at chrome layer (102a), which forms seed layer 102.

Then, above-mentioned seed layer 102 is removed (see FIG. 10B). For example, if seed layer 102 is formed on the surface of support plate 101 in the order of chrome layer (102a) and copper layer (102b), seed layer 102 is etched starting with chrome layer (102a) and then copper layer (102b). In such a case, the chrome layer is removed using an etching solution which etches chrome but does not etch copper. Then, the copper layer is removed using an etching solution which etches the copper that forms the seed layer.

(11) Next, solder-resist layers (124a, 124b) are formed on both surfaces of the substrate (a laminate of interlayer resin insulation layers and conductive circuits). Solder bumps (127a, 127b) are further formed to complete multilayer printed wiring board 110 (see FIGS. 10C-11B). Specifically, solder-resist composition 124' is applied using a roll coater method or the like, then openings are formed by laser processing, by exposure and development or the like, and cured to form solder-resist layers (124a, 124b). Then, protective layers 132, 131 are further formed in the opening portions of solder-resist layer (124b). After that, solder bumps are formed in the opening portions of the solder-resist layers.

A multilayer printed wiring board and its manufacturing method according to the second embodiment have the same effects as in the first embodiment. In addition, the multilayer printed wiring board of the second embodiment does not have an insulative substrate; thus it is suitable to reduce the thickness of a multilayer printed wiring board.

Other Embodiments

In the above embodiments, as for the metal layer formed on parts of the surface of conductive circuits, a metal layer containing Sn is employed. However, in multilayer printed wiring boards according to the embodiments of the present invention, the material of the metal layer is not limited to a metal containing Sn, but any metal containing at least one metal from among Sn, Ni, Zn, Co, Ti, Pd, Ag, Pt and Au should do. Such metals show more excellent adhesiveness with a coupling agent than Cu. However, among those, a metal layer containing Sn is preferred. The reason for that is, as described earlier, a metal containing Sn easily adheres hydroxyl groups to its surface and is especially excellent in its adhesiveness with coupling agents.

Also, in the above embodiments, as for a coupling agent that forms a coating film, silane coupling agents are employed. However, in multilayer printed wiring boards according to the embodiments of the present invention, a coupling agent is not limited to silane coupling agents, but for example, aluminate-type coupling agents, titanate-type coupling agents, zirconium-type coupling agents or the like may also be used.

Furthermore, the above silane coupling agents may be selected according to the material of the interlayer resin insulation layers. For example, when a resin composition containing epoxy resin is used for the material of the above interlayer resin insulation layers, it is preferred to select silane coupling agents having amino groups as functional groups. In such a combination, it may be easier to securely bond interlayer resin insulation layers and silane coupling agents.

If the above interlayer resin insulation layers are formed using a thermosetting resin, as for such thermosetting resins, for example, the following are listed: epoxy resin, phenol resin, polyimide resin, polyester resin, bismaleimide resin, polyorephin resin, polyphenylene ether resin, polyphenylene resin, fluororesin and the like. If the above interlayer resin insulation layers are formed using a photosensitive resin, as for such photosensitive resins, for example, acrylic resin or the like is listed.

Also, when forming opening portions in the interlayer resin insulation layers using laser processing, as for a laser to be used in such laser processing, for example, carbon dioxide gas laser, ultraviolet laser, excimer laser and the like are listed.

In a multilayer printed wiring board of the first embodiment, the total number of interlayer resin insulation layers formed on both surfaces of the insulative substrate is the same. However, the number may be different on each side of the insulative substrate.

Moreover, when forming the above metal layer, sputtering may also be used.

A predetermined metal film is formed on the surface of a conductive circuit, and a coating film made of a coupling agent is formed on the metal film. At least part of the bottom portion of a via conductor and the conductive circuit are directly connected, thereby enhancing adhesiveness between the conductive circuit and an interlayer resin insulation layer while maintaining electrical characteristics between the conductive circuit and the via conductor.

A multilayer printed wiring board according to an embodiment of the present invention includes: a first interlayer resin insulation layer; a first conductive circuit formed on the first interlayer resin insulation layer; a second interlayer resin insulation layer formed on the first interlayer resin insulation layer and the first conductive circuit, and having an opening portion that reaches the first conductive circuit; a second conductive circuit formed on the second interlayer resin insulation layer; and a via conductor formed in the opening portion and connecting the first conductive circuit and the second conductive circuit. In the multilayer printed wiring board, a metal layer, containing at least one metal from among Sn, Ni, Zn, Co, Ti, Pd, Ag, Pt and Au, is formed on the surface of the first conductive circuit, a coating film made of a coupling agent is formed on the metal layer, and at least part of the bottom portion of the via conductor is directly connected to the first conductive circuit.

A method for manufacturing a multilayer printed wiring board according to another embodiment of the present invention includes: a step to form a first interlayer resin insulation layer; a step to form a first conductive circuit on the first interlayer resin insulation layer; a step to form on at least part of the surface of the first conductive circuit a metal layer that contains at least one metal from among Sn, Ni, Zn, Co, Ti, Pd, Ag, Pt and Au; a step to form a coating film made of a coupling agent on the metal layer; a step to form a second interlayer resin insulation layer on the first interlayer resin insulation layer and on the first conductive circuit; a step to form an opening portion that penetrates the second interlayer resin insulation layer; a step to remove the metal layer exposed through the opening portion; a step to form a second conductive circuit on the second interlayer resin insulation layer; and a step to form in the opening portion a via conductor that connects the first conductive circuit and the second conductive circuit.

In a multilayer printed wiring board according to an embodiment of the present invention, a metal film containing at least one metal from among Sn, Ni, Zn, Co, Ti, Pd, Ag, Pt and Au is formed on the surface of a first conductive circuit, and a coating film made of a coupling agent is further formed on the metal film. Thus, excellent adhesiveness is achieved between conductive circuits and interlayer resin insulation layers. Also, because at least part of the bottom portion of a via conductor is directly connected to the first conductive circuit, adhesiveness between the first conductive circuit and the via conductor is also excellent. Moreover, electrical resistance between the first conductive circuit and the via conductor is low, and thus electrical characteristics are excellent.

Also, in the method for manufacturing a printed wiring board according to an embodiment of the present invention, a metal layer is formed which contains at least one metal from among Sn, Ni, Zn, Co, Ti, Pd, Ag, Pt and Au, and a coating film made of a coupling agent is formed on the metal film. When forming a via conductor, an opening portion is formed in an interlayer resin insulation layer, the coating film and the metal layer beneath the film exposed through the opening portion are removed, and then a via conductor is formed. Accordingly, a multilayer printed wiring board may be manufactured, featuring excellent adhesiveness between conductive circuits and interlayer resin insulation layers along with excellent adhesiveness between the first conductive circuit and the via conductor.

Obviously, numerous modifications and variations of the present invention are possible in light of the above teachings. It is therefore to be understood that within the scope of the appended claims, the invention may be practiced otherwise than as specifically described herein.

What is claimed is:

1. A multilayer printed wiring board comprising:

a first interlayer resin insulation layer;

a first conductive circuit formed on the first interlayer resin insulation layer;

a second interlayer resin insulation layer formed on the first interlayer resin insulation layer and the first conductive circuit;

a second conductive circuit formed on the second interlayer resin insulation layer;

a via conductor formed in the second interlayer resin insulation layer and connecting the first conductive circuit and the second conductive circuit; and a coating layer comprising at least one metal layer and a coating film and formed between the first conductive circuit and the second interlayer resin insulation layer, the metal layer being formed on a surface of the first conductive circuit and the coating film being formed on the metal layer, wherein the second interlayer resin insulation layer and the coating layer has an opening portion penetrating through the second interlayer resin insulation layer and the coating layer such that the opening portion forms an exposed portion of the first conductive circuit, and the via conductor is formed in the opening portion through the second interlayer resin insulation layer and the coating layer such that the via conductor has a bottom portion which is entirely positioned on the exposed portion of the first conductive circuit and which is directly connected to the exposed portion of the first conductive circuit.

2. The multilayer printed wiring board according to claim 1, wherein the first conductive circuit comprises an electroless plated film formed on the first interlayer resin insulation layer and an electrolytic plated film formed on the electroless plated film, and the via conductor comprises an electroless plated film formed on an inner wall of the opening portion and the exposed portion of the first conductive circuit exposed by the opening portion and an electrolytic plated film formed on the electroless plated film.

3. The multilayer printed wiring board according to claim 2, wherein the electrolytic plated film forming the first conductive circuit and the electroless plated film forming the via conductor comprise copper.

4. The multilayer printed wiring board according to claim 1, wherein the metal layer comprises a metal whose oxide has an isoelectric point of 5 or less.

5. The multilayer printed wiring board according to claim 1, wherein the metal layer comprises Sn.

6. The multilayer printed wiring board according to claim 1, wherein the surface of the first conductive circuit is formed substantially flat.

7. The multilayer printed wiring board according to claim 1, wherein the metal layer comprises at least one metal selected from the group consisting of Sn, Ni, Zn, Co, Ti, Pd, Ag, Pt and Au.

8. The multilayer printed wiring board according to claim 1, wherein the coating film comprises a coupling agent.

9. The multilayer printed wiring board according to claim 1, wherein the metal layer comprises at least one of $Cu_6Sn_5$ and $Cu_3Sn$, and the coating film comprises a coupling agent.

10. The multilayer printed wiring board according to claim 1, wherein the metal layer of the coating layer comprises a plated metal film, and the coating film comprises a coupling agent.

11. The multilayer printed wiring board according to claim 10, wherein the first conductive circuit comprises an electroless plated film formed on the first interlayer resin insulation layer and an electrolytic plated film formed on the electroless plated film, and the via conductor comprises an electroless plated film formed on an inner wall of the opening portion and the exposed portion of the first conductive circuit exposed by the opening portion and an electrolytic plated film formed on the electroless plated film.

12. The multilayer printed wiring board according to claim 11, wherein the electrolytic plated film forming the first conductive circuit and the electroless plated film forming the via conductor comprise copper.

13. The multilayer printed wiring board according to claim 10, wherein the metal layer comprises a metal whose oxide has an isoelectric point of 5 or less.

14. The multilayer printed wiring board according to claim 10, wherein the metal layer consists of Cu and Sn.

15. The multilayer printed wiring board according to claim 10, wherein the surface of the first conductive circuit is formed substantially flat.

16. The multilayer printed wiring board according to claim 10, wherein the metal layer comprises at least one metal selected from the group consisting of Sn, Ni, Zn, Co, Ti, Pd, Ag, Pt and Au.

17. The multilayer printed wiring board according to claim 1, wherein the second interlayer resin insulation layer comprises a resin composition comprising an epoxy resin, and the coating film comprises a silane coupling agent having amino groups.

18. The multilayer printed wiring board according to claim 2, wherein the second interlayer resin insulation layer comprises a resin composition comprising an epoxy resin, and the coating film comprises a silane coupling agent having amino groups.

19. The multilayer printed wiring board according to claim 10, wherein the second interlayer resin insulation layer comprises a resin composition comprising an epoxy resin, and the coupling agent of the coating film comprises a silane coupling agent having amino groups.

20. The multilayer printed wiring board according to claim 1, wherein the at least one metal layer comprises a first metal layer and a second metal layer formed on the first metal layer, the first metal layer is made of Sn and formed on the surface of the first conductive circuit, and the second metal layer is made of Sn and Cu.

21. The multilayer printed wiring board according to claim 1, wherein the metal layer of the coating layer comprises a plated metal film.

* * * * *